(12) United States Patent
Harms

(10) Patent No.: US 12,724,063 B2
(45) Date of Patent: Sep. 1, 2026

(54) TEST AND/OR MEASUREMENT SYSTEM

(71) Applicant: Rohde & Schwarz GmbH & Co. KG, Munich (DE)

(72) Inventor: Julian Harms, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 192 days.

(21) Appl. No.: 18/893,195

(22) Filed: Sep. 23, 2024

(65) Prior Publication Data

US 2026/0086140 A1 Mar. 26, 2026

(51) Int. Cl.
*G01R 31/28* (2006.01)

(52) U.S. Cl.
CPC ................................ *G01R 31/2822* (2013.01)

(58) Field of Classification Search
CPC ............................ G01R 31/2822; G01R 27/32
See application file for complete search history.

(56) References Cited

U.S. PATENT DOCUMENTS

| | | | | |
|---|---|---|---|---|
| 7,046,716 | B1 * | 5/2006 | Miao ...................... | H04B 1/406 370/208 |
| 10,845,401 | B2 | 11/2020 | Verspecht et al. | |
| 11,353,536 | B2 | 6/2022 | Anderson et al. | |
| 2018/0252791 | A1 * | 9/2018 | Leibfritz ............. | G01R 35/005 |
| 2022/0260662 | A1 | 8/2022 | Anderson et al. | |

* cited by examiner

*Primary Examiner* — Tung X Nguyen
(74) *Attorney, Agent, or Firm* — CHRISTENSEN O'CONNOR JOHNSON KINDNESS PLLC

(57) ABSTRACT

A test and/or measurement system for testing a device under test is described. The test and/or measurement system includes at least a first port and a second port for connecting the device under test. The test and/or measurement system also includes four measurement modules that each have a high dynamic analog-to-digital converter. At least one of the first to fourth measurement modules additionally includes a high bandwidth analog-to-digital converter. This measurement module is configured to selectively connect the high dynamic analog-to-digital converter or the high bandwidth analog-to-digital converter to a respective output of a corresponding directive device to which the measurement module is connected.

20 Claims, 1 Drawing Sheet

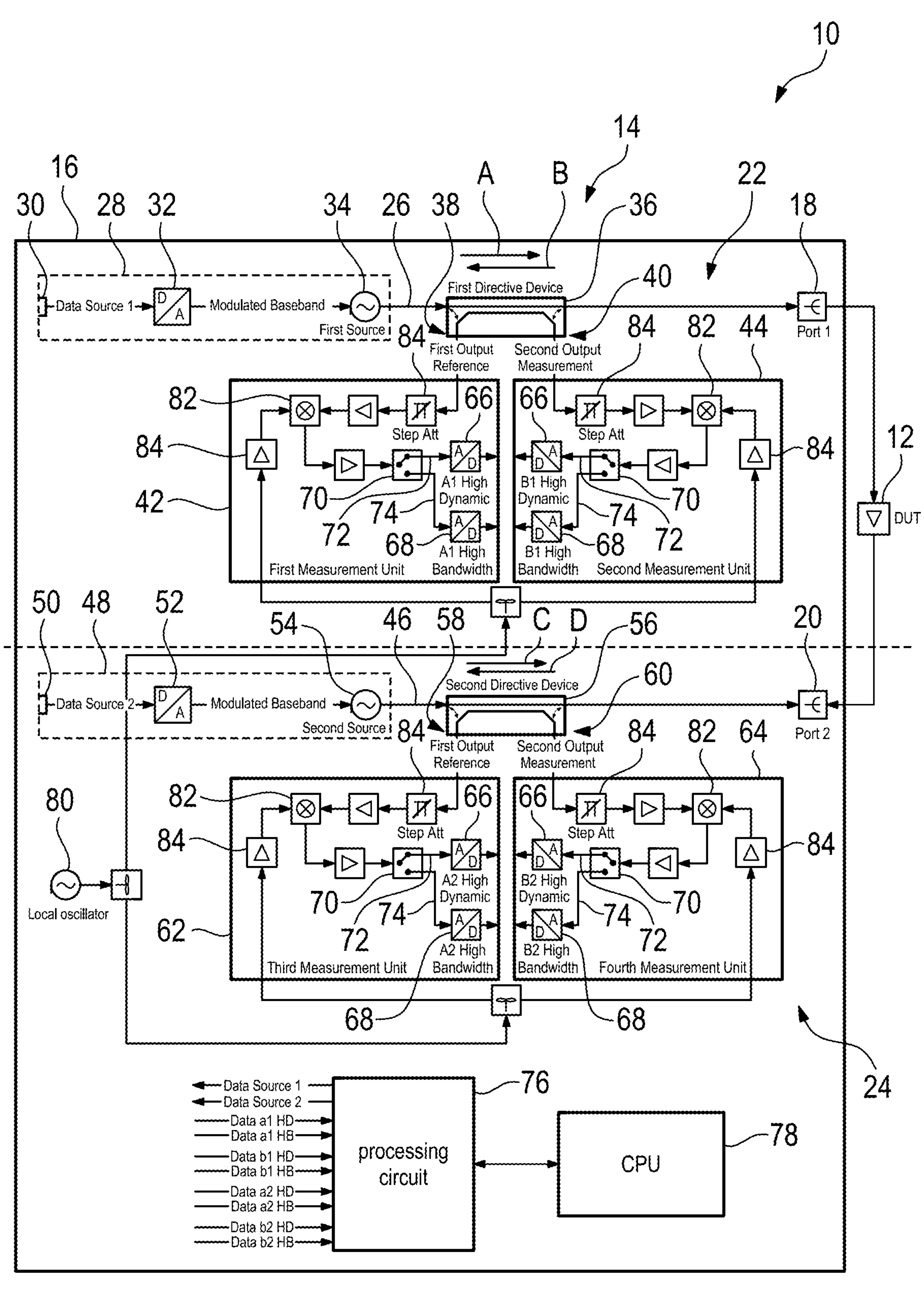

10
14
16
22
A
B
30
28
32
34
26
38
36
18
40
Data Source 1
Modulated Baseband
First Source
First Directive Device
First Output Reference
Second Output Measurement
Port 1
84
82
44
66
Step Att
A1 High Dynamic
A1 High Bandwidth
B1 High Dynamic
B1 High Bandwidth
First Measurement Unit
Second Measurement Unit
12
DUT
42
70
72
74
68
50
48
52
54
46
58
C
D
56
20
60
Data Source 2
Modulated Baseband
Second Source
Second Directive Device
Port 2
64
80
62
Local oscillator
A2 High Dynamic
A2 High Bandwidth
B2 High Dynamic
B2 High Bandwidth
Third Measurement Unit
Fourth Measurement Unit
24
Data Source 1
Data Source 2
Data a1 HD
Data a1 HB
Data b1 HD
Data b1 HB
Data a2 HD
Data a2 HB
Data b2 HD
Data b2 HB
processing circuit
76
CPU
78

TEST AND/OR MEASUREMENT SYSTEM

FIELD OF THE DISCLOSURE

Embodiments of the present disclosure relate to a test and/or measurement system for testing a device under test.

BACKGROUND

In the state of the art, several different test and/or measurement devices are known which are used for specific tasks to characterize a device under test, for instance vector network analyzers (VNAs), spectrum analyzers (SPAs), and vector signal generators (VSGs). Generally, the respective characterizations are done in order to calibrate the device under test.

For characterizing a passive device under test, (vector) network analyzers are used in order to measure scattering parameters (S-parameters). Typically, the network analyzers use swept continuous wave (CW) signals for stimulation and narrowband receivers for high dynamics. Active devices under test, however, can behave differently in terms of characterization, which depends on the power density spectrum of the stimulus signal.

In general, customers would like to characterize their respective devices under test under real scenarios that correspond to the subsequent operating situation.

Until now, tests for active devices under test have been carried out with CW signals and (nonlinear) vector network analyzers (N)VNAs)), in order to draw conclusions about the behavior of the active devices under test for broadband stimulation based on CW measurement variables like compression point, intermodulation distortion and/or third order intercept point (IP3).

In addition, measurement variables like adjacent channel leakage power ratio (ACLR), or noise power ratio (NPR) require a broadband stimulation.

Hence, it is necessary in the state of the art to perform different tests and/or measurements by using different test and/or measurement devices in order to characterize the device under test in the intended manner, causing high efforts.

Accordingly, there is a need for characterizing the device under test in a more efficient manner.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

Embodiments of the present disclosure provide a test and/or measurement system for testing a device under test. In an embodiment, the test and/or measurement system comprises at least a first port and a second port for connecting the device under test.

The test and/or measurement system comprises a first measurement path that is connected to the first port. A first directive device is incorporated within the first measurement path, wherein the first directive device comprises a first output and a second output. The first directive device is configured to output via the first output a radio frequency signal which travels on the first measurement path towards the first port. The first directive device is configured to output via the second output a radio frequency signal which travels on the first measurement path away from the first port.

The test and/or measurement system comprises a second measurement path that is connected to the second port. A second directive device is incorporated within the second measurement path. The second directive device comprises a first output and a second output. The second directive device is configured to output via the first output a radio frequency signal which travels on the second measurement path towards the second port. The second directive device is configured to output via the second output a radio frequency signal which travels on the second measurement path away from the second port.

The test and/or measurement system further comprises a first measurement module, a second measurement module, a third measurement module, and a fourth measurement module. The first output of the first directive device is connected to the first measurement module. The second output of the first directive device is connected to the second measurement module. The first output of the second directive device is connected to the third measurement module. The second output of the second directive device is connected to the fourth measurement module. The first measurement module, the second measurement module, the third measurement module, and the fourth measurement module each comprise a high dynamic analog-to-digital converter. At least one specific measurement module of the first measurement module to fourth measurement module additionally comprises a high bandwidth analog-to-digital converter. The at least one specific measurement module is the first measurement module, the second measurement module, the third measurement module and/or the fourth measurement module.

The main idea is to provide a test and/or measurement system that is capable of performing the necessary tests and/or measurements required for calibrating a device under test by using a single connection. Consequently, it is not necessary to disconnect the device under test from a certain test and/or measurement device in order to connect the device under test to another test and/or measurement device, which would require an unscrewing action.

In an embodiment, the test and/or measurement system provides at least one measurement module that enables high dynamic measurements and high bandwidth measurements, namely the at least one specific measurement module. In an embodiment, the at least one specific measurement module comprises the high dynamic analog-to-digital converter and the high bandwidth analog-to-digital converter between which the at least one specific measurement module can toggle, thereby enabling the high dynamic measurements and the high bandwidth measurements. The respective selection is done in baseband so as to selectively connect the high dynamic analog-to-digital converter or the high bandwidth analog-to-digital converter to the respective output of the corresponding directive device to which the at least one specific measurement module is connected.

In an embodiment, the respective architecture of the test and/or measurement system provides respective receiving paths, namely high dynamic receiving paths and at least one high bandwidth receiving path. The high dynamic analog-to-digital converters are associated with the high dynamic receiving paths, whereas the at least one high bandwidth analog-to-digital converter is associated with the at least one high bandwidth receiving path.

Since the high dynamic receiving paths and the at least one high bandwidth receiving path are separated from each other, the test and/or measurement system has a dynamic range that corresponds to the full dynamic range of a vector network analyzer, which can be used for performing the tests and/or measurements, e.g. for measuring the scattering parameters.

Generally, the specific measurement module is defined by the fact that it comprises the high dynamic analog-to-digital converter and additionally the high bandwidth analog-to-digital converter. It is not necessary that all measurement modules comprise both kinds of analog-to-digital converters, but at least one of the measurement modules comprises both kinds of analog-to-digital converters, namely the high dynamic analog-to-digital converter and the high bandwidth analog-to-digital converter, thereby enabling the test and/or measurement system to perform high dynamic measurements and high bandwidth measurements without re-connecting the device under test.

To enable the test and/or measurement system to perform the desired tests and/or measurements to characterize in the device under test, the number of high dynamic analog-to-digital converters relates to two times N, namely 2×N, wherein N represent the number of ports of the test and/or measurement system. Assuming a test and/or measurement system having four ports, the number of high dynamic analog-to-digital converters is eight. Hence, the test and/or measurement system would have eight measurement modules that each comprise a high dynamic analog-to-digital converter. In contrast thereto, the number of high bandwidth analog-to-digital converters can be reduced compared to the number of high dynamic analog-to-digital converters, which actually depends on the specific application scenario. However, at least one high bandwidth analog-to-digital converter should be provided.

The overall architecture of the test and/or measurement system is based on a vector network analyzer (VNA), which however is enhanced by the components establishing the separation between the receiving paths, namely high dynamic receiving paths and at least one high bandwidth receiving path.

In an embodiment, the bandwidth of the high bandwidth analog-to-digital converters is higher than the bandwidth of the high dynamic analog-to-digital converter. In an embodiment, the dynamic of the high dynamic analog-to-digital converter however is higher than the dynamic of the high bandwidth analog-to-digital converters.

Generally, the high bandwidth analog-to-digital converter can be one analog-to-digital converter module or several analog-to-digital converter modules connected with each other. Additionally or alternatively, the high dynamic analog-to-digital converter can be one analog-to-digital converter module or several analog-to-digital converter modules connected with each other.

Hence, the high bandwidth or the high dynamic may be ensured by the interaction of several analog-to-digital converter modules interacting with each other.

An aspect provides that the test and/or measurement system comprises, for example, two or more specific measurement modules, each comprising a high bandwidth analog-to-digital converter in addition to the high dynamic analog-to-digital converter. Hence, the test and/or measurement system may comprise several specific measurement modules rather than a single one, e.g., several measurement modules with a high dynamic analog-to-digital converter and a high bandwidth analog-to-digital converter. In an embodiment, all measurement modules have a high dynamic analog-to-digital converter and a high bandwidth analog-to-digital converter.

According to an example embodiment, the first measurement module is the at least one specific measurement module such that the first measurement module is configured to selectively connect the high dynamic analog-to-digital converter or the high bandwidth analog-to-digital converter to the first output of the first directive device.

According to another example embodiment, the second measurement module is the at least one specific measurement module such that the second measurement module is configured to selectively connect the high dynamic analog-to-digital converter or the high bandwidth analog-to-digital converter to the second output of the first directive device.

According to a further example embodiment, the third measurement module is the at least one specific measurement module such that the third measurement module is configured to selectively connect the high dynamic analog-to-digital converter or the high bandwidth analog-to-digital converter to the first output of the second directive device.

According to another example embodiment, the fourth measurement module is the at least one specific measurement module such that the third measurement module is configured to selectively connect the high dynamic analog-to-digital converter or the high bandwidth analog-to-digital converter to the second output of the second directive device.

As indicated above, the test and/or measurement system can comprise several specific measurement modules, namely several measurement modules that have a high dynamic analog-to-digital converter and additionally a high bandwidth analog-to-digital converter. Consequently, each of the first to fourth measurement modules may be the specific measurement module. Moreover, all of the first to fourth measurement modules may be specific measurement modules.

In one or more embodiments, the measurement modules, namely the first to fourth measurement modules, for example all measurement modules of the test and/or measurement system, may be configured in the same manner. Hence, they only distinguish from each other with regard to the respective directive device to which they are connected, for example the corresponding of the respective directive device.

A further aspect provides that the test and/or measurement system, for example, is configured to be selectively operated in a high dynamic measurement mode or a high bandwidth measurement mode. In an embodiment, the test and/or measurement system is operated either in the high dynamic measurement mode or the high bandwidth measurement mode. The modes distinguish from each other with regard to the at least one specific measurement module, for example whether the high dynamic analog-to-digital converter or the high bandwidth analog-to-digital converter is connected to the respective output of the corresponding directive device. The selection is done such that either the high dynamic receiving path or the high bandwidth receiving path of the at least one specific measurement module is selected, e.g. activated.

In an embodiment, the at least one specific measurement module may be configured to connect the high dynamic analog-to-digital converter to the respective output of the corresponding directive device when the test and/or measurement system is operated in the high dynamic measurement mode, wherein the at least one specific measurement module is also configured to connect the high bandwidth analog-to-digital converter to the respective output of the corresponding directive device when the test and/or measurement system is operated in the high bandwidth measurement mode. Hence, the respective operation mode of the test and/or measurement system is defined by the kind of analog-to-digital converter which is connected to the respective output of the corresponding directive device, namely either the high dynamic analog-to-digital converter in the high dynamic measurement mode or the high bandwidth analog-to-digital converter in the high bandwidth measurement mode.

According to an example embodiment, the first measurement module is the at least one specific measurement module such that the first measurement module is configured to connect the high dynamic analog-to-digital converter to the first output of the first directive device when the test and/or measurement system is operated in the high dynamic measurement mode, and wherein the first measurement module is configured to connect the high bandwidth analog-to-digital converter to the first output of the first directive device when the test and/or measurement system is operated in the high bandwidth measurement mode.

According to another example embodiment, the second measurement module is the at least one specific measurement module such that the second measurement module is configured to connect the high dynamic analog-to-digital converter to the second output of the first directive device when the test and/or measurement system is operated in the high dynamic measurement mode, and wherein the second measurement module is configured to connect the high bandwidth analog-to-digital converter to the second output of the first directive device when the test and/or measurement system is operated in the high bandwidth measurement mode.

According to a further example embodiment, the third measurement module is the at least one specific measurement module such that the third measurement module is configured to connect the high dynamic analog-to-digital converter to the first output of the second directive device when the test and/or measurement system is operated in the high dynamic measurement mode, and wherein the third measurement module is configured to connect the high bandwidth analog-to-digital converter to the first output of the second directive device when the test and/or measurement system is operated in the high bandwidth measurement mode.

According to another example embodiment, the fourth measurement module is the at least one specific measurement module such that the fourth measurement module is configured to connect the high dynamic analog-to-digital converter to the second output of the second directive device when the test and/or measurement system is operated in the high dynamic measurement mode, and wherein the fourth measurement module is configured to connect the high bandwidth analog-to-digital converter to the second output of the second directive device when the test and/or measurement system is operated in the high bandwidth measurement mode.

As already indicated above, each of the measurement modules of the test and/or measurement system may relate to the specific measurement module, namely the first measurement module, the second measurement module, the third measurement module and/or the fourth measurement module. In an embodiment, the test and/or measurement system may comprise several specific measurement modules. In case all of the measurement modules of the test and/or measurement system relate to the specific measurement modules, all high dynamic analog-to-digital converters are connected to the respective outputs of the corresponding directive devices simultaneously when the test and/or measurement system is operated in the high dynamic measurement mode. In the high bandwidth measurement mode, all high bandwidth analog-to-digital converters are connected to the respective outputs of the corresponding directive devices simultaneously.

In an embodiment, the test and/or measurement system may comprise a first signal source, wherein the first directive device is interconnected between the first signal source and the first port, wherein the first signal source is configured to generate a radio frequency signal to be forwarded to the first port, and wherein the radio frequency signal is a continuous wave signal or a modulated signal. The first signal source may generate the radio frequency signal based on a first modulated baseband signal received, e.g. from a first digital-to-analog converter that receives data from a first data source. The first signal source may relate to a broadband signal source such that the radio frequency signal generated may be a broadband radio frequency signal.

In an embodiment, the test and/or measurement system may comprise a second signal source, wherein the second directive device is interconnected between the second signal source and the second port, wherein the second signal source is configured to generate a radio frequency signal to be forwarded to the second port, and wherein the radio frequency signal is a continuous wave signal or a modulated signal. The second signal source may generate the radio frequency signal based on a second modulated baseband signal received, e.g. from a second digital-to-analog converter that receives data from a second data source. The second signal source may relate to a broadband signal source such that the radio frequency signal generated may be a broadband radio frequency signal.

In an embodiment, the first data source and the second data source may relate to a common data source for both digital-to-analog converters.

Another aspect provides that the test and/or measurement system, for example, comprises a processing circuit that is configured to obtain data streams from the high dynamic analog-to-digital converters and a data stream from the high bandwidth analog-to-digital converter. In an embodiment, the processing circuit may be a field-programmable gate array (FPGA) or a digital signal processor (DSP). Generally, the processing circuit may be connected with all receiving paths, for example all high dynamic analog-to-digital converters and high bandwidth analog-to-digital converter(s) for receiving the respective data streams gathered by the different analog-to-digital converter(s). Consequently, the processing circuit is also configured to obtain data streams from all high dynamic analog-to-digital converters and high bandwidth analog-to-digital converter(s).

For instance, the processing circuit is configured to correlate at least parts of the data streams with each other. This means that the processing circuit is configured to correlate between a subset of the high dynamic receiving paths or between a subset of the high bandwidth receiving paths with each other, respectively. However, the processing circuit may be configured to correlate the data stream from the high dynamic analog-to-digital converter and the data stream from the high bandwidth analog-to-digital converter with each other. Hence, further information can be obtained by correlating the data gathered from the high dynamic receiving path(s) and/or the data gathered from the high bandwidth receiving path(s). As indicated above, the processing circuit may correlate the data streams of one measurement module, for example the different kinds of receiving paths, and/or the data streams of all measurement modules, for example the different kinds of receiving paths, namely the high dynamic receiving path(s) and the high bandwidth receiving path(s). The correlation may also be done among the different measurement modules of the test and/or measurement system.

In an embodiment, all data of the data streams may be used for the correlation. In any case, parts of the data streams are correlated with each other that have (roughly) the same sample rate.

In an embodiment, the processing circuit may be configured to apply a filtering function and/or a mixing function to at least one of the data streams. Hence, the respective data streams may be processed further by the processing circuit in order to obtain further insights, e.g. simplifying the testing and/or measuring.

According to a further aspect, the at least one specific measurement module, for example, comprises a switching unit that is configured to connect the high dynamic analog-to-digital converter or the high bandwidth analog-to-digital converter to the respective output of the corresponding directive device, wherein the switching unit is controlled by the processing circuit. The switching unit may have two switching positions, namely a first switching position in which the high dynamic analog-to-digital converter is connected with the respective output of the corresponding directive device via the switching unit as well as a second switching position in which high bandwidth analog-to-digital converter is connected with the respective output of the corresponding directive device via the switching unit. Accordingly, the switching unit may be a two-way switch, also called toggle switch. The switching position is controlled by the processing circuit accordingly.

In a certain example embodiment, the test and/or measurement system comprises a first signal source and a second signal source. The first directive device is interconnected between the first signal source and the first port. The first signal source is configured to generate a radio frequency signal to be forwarded to the first port. The radio frequency signal is a continuous wave signal or a modulated signal. The second directive device is interconnected between the second signal source and the second port. The second signal source is configured to generate a radio frequency signal to be forwarded to the second port. The radio frequency signal is a continuous wave signal or a modulated signal. Hence, two different signal sources are provided, which may relate to the ones discussed above. The signal sources are associated with the directive devices in a unambiguous manner, as the first signal source is connected to the first directive device, whereas the second signal source is connected to the second directive device.

In an embodiment, the processing circuit may be configured to control the first signal source and/or the second signal source. The signal source(s) may be controlled by the processing circuit that outputs control signals to the signal source(s) accordingly. The controlling may be done in an indirect manner by controlling the data source(s) which provide the digital data based on which the first signal source and/or the second signal source generate the radio frequency signal(s).

In general, the respective signal source, the corresponding digital-to-analog converter as well as the data source may together form a signal source assembly. Hence, the processing circuit may be configured to control the first signal source assembly and/or the second signal source assembly.

In an embodiment, the processing circuit may also be configured to calculate a pre-distortion for generating the radio frequency signal generated by the first signal source and/or a pre-distortion for generating the radio frequency signal generated by the second signal source. Hence, the processing circuit may control the first signal source and/or the second signal source based on the calculated pre-distortion, thereby ensuring more accurate tests and/or measurements.

A further aspect provides that the test and/or measurement system, for example, comprises a local oscillator. In an embodiment, the first measurement module, the second measurement module, the third measurement module, and the fourth measurement module each comprise at least one mixing unit. The mixing units are connected to the local oscillator. Hence, the different measurement modules use the same local oscillator signal for mixing the radio frequency signal for further processing, e.g. prior to the separation of the respective receiving paths. Thus, the local oscillator is a common local oscillator. By using the same local oscillator signal, phase coherence of the mixed signals processed further via the respective receiving paths can be ensured for the different measurement modules.

In an embodiment, the first measurement module, the second measurement module, the third measurement module, and/or the fourth measurement module may comprise a switchable attenuator, an amplifier and/or a filter. The respective measurement modules may comprise further components for processing the radio signals received. In an embodiment, the further components may be located prior to the respective switching unit, e.g. prior to separating the receiving paths. The switchable attenuator may be controlled by the processing circuit, e.g. based on the controlling of the signal source(s).

A further aspect provides, for example that the first measurement module, the second measurement module, the third measurement module, and the fourth measurement module are commonly housed in a housing of the test and/or measurement system. Since a common housing is provided, the test and/or measurement system relates to a single test and/or measurement device having only the ports via which the device under test is connected once.

According to another example embodiment, the first directive device and/or the second directive device comprises at least one directive coupler and/or a resistive bridge. The respective directive device may be established by a plurality of cascaded directive couplers.

In an embodiment, the first directive device and/or the second directive device are/is configured to adjust a coupling factor based on information gathered. The information may be gathered from the device under test and/or the operation mode of the test and/or measurement system, namely based on information gathered while performing the tests and/or measurements. Since the coupling factor can be adjusted, different measurements for different coupling factors can be done without reconnecting the device under test, as the coupling factor is adjusted within the test and/or measurement system while the device under test is still connected with the ports of the test and/or measurement system.

Another aspect provides, for example, that the test and/or measurement system is configured to be operated in a calibration mode, wherein different calibration standards are alternatively connectable to the first port and the second port, wherein the test and/or measurement system is configured to calculate correction data and to apply the calculated correction data in a high dynamic measurement mode and in a high bandwidth measurement mode of the test and/or measurement system. Besides the device under test, the ports can be used for being connected to calibration standards accordingly.

The architecture of the test and/or measurement system ensures, for example, that all established and common calibration processes from network analysis can be used, namely 10 term calibration correction, 7 term calibration correction, phases, and/or similar processes. The processing circuit can exchange and calculate correction terms between the receiving paths so that the test and/or measurement system only needs to be calibrated once for a measurement setup. Defined phase relationships between the transmit paths and the receiving paths are also ensured by the architecture of the test and/or measurement system.

Moreover, the architecture of the test and/or measurement system may also enable an extension of the test and/or measurement system by including a further measurement assembly. In an embodiment, the measurement assembly comprises a port, a directive device and two measurement modules. Optionally, the measurement assembly may also comprise a signal source.

In an embodiment, the architecture also allows an extension of the receiving sub-architecture via a hardware mirror selection.

In an embodiment, the controlling of the controllable components can be controlled by the processor circuit which relates, for example, to a central processing circuit.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

The FIGURE schematically shows an overview of a test and/or measurement setup comprising a test and/or measurement system according to an embodiment the present disclosure, and a device under test.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

The FIGURE schematically shows a test and/or measurement setup 10 comprising a device under test (DUT) 12 and a test and/or measurement system 14 connected with the device under test 12. The test and/or measurement system 14 comprises a housing 16 that encompasses all processing components of the test and/or measurement system 14. At the outer surface of the housing 16, a first port 18 and a second port 20 are provided to which the device under test 12 is connected.

The processing components of the test and/or measurement system 14 are associated to a first measurement assembly 22 and a second measurement assembly 24. The first measurement assembly 22 comprises a first measurement path 26 that is connected to the first port 18 and a first signal source assembly 28 that comprises a first data source 30 providing digital data, a first digital-to-analog converter 32 that converts the digital data received into a modulated baseband signal, and a first signal source 34 that processes the modulated baseband signal in order to generate a radio frequency (RF) signal that is forwarded via the first measurement path 26 to the first port 18.

A first directive device 36 is incorporated within the first measurement path 26, which comprises a first output 38 and a second output 40. The first directive device 36 is configured to output via the first output 38 a radio frequency signal which travels on the first measurement path 26 towards the first port 18, wherein the travel direction of the respective radio frequency signal is indicated by A in the FIGURE. The first directive device 36 is also configured to output via the second output 40 a radio frequency signal which travels on the first measurement path 26 away from the first port 18, wherein the travel direction of the respective radio frequency signal is indicated by B in the FIGURE.

The first output 38 of the first directive device 36 is connected to a first measurement module 42, whereas the second output 40 of the first directive device 36 is connected to a second measurement module 44.

The respective architecture of the measurement modules 42, 44 will be described later in more detail.

The second measurement assembly 24 comprises a second measurement path 46 that is connected to the second port 20 and a second signal source assembly 48 that comprises a second data source 50 providing digital data, a second digital-to-analog converter 52 that converts the digital data received into a modulated baseband signal, and a second signal source 54 that processes the modulated baseband signal in order to generate a radio frequency, RF, signal that is forwarded via the second measurement path 46 to the second port 20.

A second directive device 56 is incorporated within the second measurement path 46, which comprises a first output 58 and a second output 60. The second directive device 56 is configured to output via the second output 58 a radio frequency signal which travels on the second measurement path 46 towards the second port 20, wherein the travel direction of the respective radio frequency signal is indicated by C in the FIGURE. The second directive device 56 is also configured to output via the second output 60 a radio frequency signal which travels on the second measurement path 46 away from the second port 20, wherein the travel direction of the respective radio frequency signal is indicated by D in the FIGURE.

The first output 58 of the second directive device 56 is connected to a third measurement module 62, whereas the second output 40 of the second directive device 56 is connected to a fourth measurement module 64.

Generally, the directive devices 36, 56 comprises at least one directive coupler as shown in the FIGURE. For instance, the directive devices 36, 56 may also comprise plurality of cascaded directive couplers. Alternatively, the directive devices 36, 56 may comprise a resistive bridge.

In the shown embodiment, each of the measurement modules 42, 44, 62, 64, namely the first measurement module 42, the second measurement module 44, the third measurement module 62, and the fourth measurement module 64, are established in a similar manner.

Hence, each of the measurement modules 42, 44, 62, 64 comprises a high dynamic (HD) analog-to-digital converter 66 as well as a high bandwidth (HB) analog-to-digital converter 68. Even though it is shown that all measurement modules 42, 44, 62, 64 comprise a high bandwidth (HB) analog-to-digital converter 68, it might be sufficient that only one or fewer than all measurement modules 42, 44, 62, 64 comprise a high bandwidth (HB) analog-to-digital converter 68.

Accordingly, each measurement module 42, 44, 62, 64 having a high dynamic (HD) analog-to-digital converter 66 and, additionally, a high bandwidth (HB) analog-to-digital converter 68 is a specific measurement module. In other words, all measurement modules 42, 44, 62, 64 are specific measurement modules in the shown embodiment, but it is sufficient that only one of the measurement modules is a specific one that comprises both kinds of analog-to-digital converters, namely the high dynamic (HD) analog-to-digital converter 66 and the high bandwidth (HB) analog-to-digital converter 68.

In an embodiment, the measurement modules 42, 44, 62, 64 are configured to selectively connect the high dynamic analog-to-digital converter 66 or the high bandwidth analog-to-digital converter 68 to the respective output of the corresponding directive device. Specifically, the first measurement module 42 is configured to selectively connect the high dynamic analog-to-digital converter 66 or the high bandwidth analog-to-digital converter 68 to the first output 38 of the first directive device 36. The second measurement module 44 is configured to selectively connect the high dynamic analog-to-digital converter 66 or the high bandwidth analog-to-digital converter 68 to the second output 40 of the first directive device 36. The third measurement module 62 is configured to selectively connect the high dynamic analog-to-digital converter 66 or the high bandwidth analog-to-digital converter 68 to the first output 58 of the second directive device 56. The fourth measurement module 64 is configured to selectively connect the high dynamic analog-to-digital converter 66 or the high bandwidth analog-to-digital converter 68 to the second output 60 of the second directive device 56.

In an embodiment, the respective selection is ensured by a switching unit 70 that is located upstream of the converters 66, 68 in each measurement module 42, 44, 62, 64. Accordingly, a high dynamic receiving path 72 as well as a high bandwidth receiving path 74 originate from the switching unit 70, wherein the high dynamic analog-to-digital converter 66 is located in the high dynamic receiving path 72, and wherein the high bandwidth analog-to-digital converter 68 is located in the high bandwidth receiving path 74.

In an embodiment, the test and/or measurement system 14 also comprises a central processing circuit 76 that is configured to control the switching units 70, thereby performing the selection between the high dynamic receiving paths 72 as well as a high bandwidth receiving paths 74. Accordingly, the test and/or measurement system 14 is selectively operated either in a high dynamic measurement mode or in a high bandwidth measurement mode.

Due to the controlling of the switching units 70, the first measurement module 42 connects its high dynamic analog-to-digital converter 66 to the first output 38 of the first directive device 36 when the test and/or measurement system 16 is operated in the high dynamic measurement mode. Further, the first measurement module 42 connects its high bandwidth analog-to-digital converter 68 to the first output 38 of the first directive device 36 when the test and/or measurement system 16 is operated in the high bandwidth measurement mode.

In addition, the second measurement module 44 connects its high dynamic analog-to-digital converter 66 to the second output 40 of the first directive device 36 when the test and/or measurement system 16 is operated in the high dynamic measurement mode. Further, the second measurement module 44 connects its high bandwidth analog-to-digital converter 68 to the second output 40 of the first directive device 36 when the test and/or measurement system 16 is operated in the high bandwidth measurement mode.

Moreover, the third measurement module 62 connects its high dynamic analog-to-digital converter 66 to the first output 58 of the second directive device 56 when the test and/or measurement system 16 is operated in the high dynamic measurement mode. Further, the third measurement module 62 connects its high bandwidth analog-to-digital converter 68 to the first output 58 of the second directive device 56 when the test and/or measurement system 16 is operated in the high bandwidth measurement mode.

Furthermore, the fourth measurement module 64 connects its high dynamic analog-to-digital converter 66 to the second output 60 of the second directive device 56 when the test and/or measurement system 16 is operated in the high dynamic measurement mode. Further, the fourth measurement module 64 connects its high bandwidth analog-to-digital converter 68 to the second output 60 of the second directive device 56 when the test and/or measurement system 16 is operated in the high bandwidth measurement mode.

In an embodiment, the central processing circuit 76 also controls the first signal source assembly 28 and the second signal source assembly 48, for example the first signal source 34 and the second signal source 54, thereby generating radio frequency signals for testing the device under test 12. The radio frequency signals may be continuous wave signals or modulated signals. Moreover, a pre-distortion may be calculated by the processing circuit 76 for generating the radio frequency signal(s).

Besides the controlling, the central processing circuit 76 obtains data streams from the high dynamic analog-to-digital converters 66 and data streams from the high bandwidth analog-to-digital converters 68, as illustrated in the FIGURE.

For analyzing purposes, the processing circuit 76, for example, is enabled to correlate at least parts of the data streams with each other, e.g. the data streams from the high dynamic analog-to-digital converters 66 and the data streams from the high bandwidth analog-to-digital converters 68 with each other. The processing circuit 76 is also configured to correlate between a subset of the high dynamic receiving paths 72 with each other or between a subset of the high bandwidth receiving paths 74 with each other, respectively. This may be done for each measurement module 42, 44, 62, 64 separately or for all measurement modules 42, 44, 62, 64 commonly. For further processing, the processing circuit 76 may apply a filtering function and/or a mixing function to the data streams obtained.

In an embodiment, the test and/or measurement system 14 comprises a central processing unit 78 that is connected with the processing circuit 76 in a bidirectional manner. Accordingly, data may be exchanged between the processing circuit 76 and the central processing unit 78 such that the data of the data streams may be processed further by the central processing unit 78, for instance for visualization. Moreover, the central processing unit 78 may forward control signals to the processing circuit 76 for controlling the data sources 30, 50 accordingly, e.g. based on a user input of the test and/or measurement system 16.

In an embodiment, the test and/or measurement system 16 comprises a local oscillator 80 that provides a local oscillator signal (LO) signal. The measurement modules 42, 44, 62, 64 comprise a mixing unit 82 that receives the LO signal from the local oscillator 80 as well as the respective radio frequency signal(s) such that a mixed signal is obtained which is forwarded to the receiving paths 72, 74, namely the high dynamic analog-to-digital converters 66 and the high bandwidth analog-to-digital converters 68 via the switching units 70.

In an embodiment, besides the mixing units 82, the measurement modules 42, 44, 62, 64 also comprise further signal processing components 84, namely a switchable attenuator, an amplifier and/or a filter as illustrated in the FIGURE.

As discussed above, the test and/or measurement system 14 ensures that the device under test 12 has to be connected only once. In other words, changing the test and/or measurement devices can be omitted. Consequently, it is also not necessary to re-connect the device under test 12, thereby reducing the efforts significantly while improving the accuracy simultaneously.

In addition, the test and/or measurement system 14 can be operated in a calibration mode, wherein different calibration standards are alternatively connectable to the first port 18 and the second port 20. The test and/or measurement system 16, for example the processing circuit 76 or the central processing unit 78, calculates correction data that can be applied in the high dynamic measurement mode and in the high bandwidth measurement mode of the test and/or measurement system 14 when testing the device under test 12 afterwards.

Certain embodiments disclosed herein include systems, apparatus, modules, units, devices, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits,"etc., can be used synonymously herein.

In an embodiment, circuitry includes, among other things, one or more computing devices such as a processor (e.g., a microprocessor), a central processing unit (CPU), a graphics processing unit (GPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implementing the functionality described herein.

Of course, in an embodiment, two or more of these components, or parts thereof, can be integrated or share hardware and/or software, circuitry, etc. In an embodiment, these components, or parts thereof, may be grouped in a single location or distributed over a wide area. In circumstances where the components are distributed, the components are accessible to each other via communication links.

In an embodiment, one or more of the components of the test and/or measurement system 14 referenced above include circuitry programmed to carry out some or all of the functionalities and methodologies disclosed herein. In an embodiment, one or more computer-readable media associated with or accessible by such circuitry contains computer readable instructions embodied thereon that, when executed by such circuitry, cause the component or circuity to perform some or all of the functionalities and methodologies disclosed herein.

In an embodiment, the computer readable instructions includes applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In an embodiment, computer-readable media is any medium that stores computer readable instructions, or other information non-transitorily and is directly or indirectly accessible by a computing device, such as processor circuitry, etc., or other circuity disclosed herein etc. In other words, a computer-readable medium is a non-transitory memory at which one or more computing devices can access instructions, codes, data, or other information. As a non-limiting example, a computer-readable medium may include a volatile random access memory (RAM), a persistent data store such as a hard disk drive or a solid-state drive, or a combination thereof. In an embodiment, memory can be integrated with a processor, separate from a processor, or external to a computing system.

Accordingly, blocks of the block diagrams and/or flowchart illustrations support various combinations for performing the specified functions, combinations of operations for performing the specified functions and program instructions for performing the specified functions. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

It will be appreciated that in one or more embodiments, the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), a graphics processing unit (GPU) or the like, or any combinations thereof.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc.

The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B. ". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A test and/or measurement system for testing a device under test, wherein the test and/or measurement system comprises:

at least a first port and a second port for connecting the device under test;

a first measurement path that is connected to the first port, wherein a first directive device is incorporated within the first measurement path, wherein the first directive device comprises a first output and a second output, wherein the first directive device is configured to output via the first output a radio frequency signal which travels on the first measurement path towards the first port, and wherein the first directive device is configured to output via the second output a radio frequency signal which travels on the first measurement path away from the first port;

a second measurement path that is connected to the second port, wherein a second directive device is incorporated within the second measurement path, wherein the second directive device comprises a first output and a second output, wherein the second directive device is configured to output via the first output a radio frequency signal which travels on the second measurement path towards the second port, and wherein the second directive device is configured to output via the second output a radio frequency signal which travels on the second measurement path away from the second port;

a first measurement module, a second measurement module, a third measurement module, and a fourth measurement module, wherein the first output of the first directive device is connected to the first measurement module, wherein the second output of the first directive device is connected to the second measurement module, wherein the first output of the second directive device is connected to the third measurement module, wherein the second output of the second directive device is connected to the fourth measurement module, wherein the first measurement module, the second measurement module, the third measurement module, and the fourth measurement module each comprise a high dynamic analog-to-digital converter, wherein at least one specific measurement module of the first to fourth measurement modules additionally comprises a high bandwidth analog-to-digital converter, and wherein the at least one specific measurement module is configured to selectively connect the high dynamic analog-to-digital converter or the high bandwidth analog-to-digital converter to the respective output of the corresponding directive device.

2. The test and/or measurement system according to claim 1, further comprising two or more specific measurement modules which each comprise a high bandwidth analog-to-digital converter in addition to the high dynamic analog-to-digital converter.

3. The test and/or measurement system according to claim 1, wherein the first measurement module is the at least one specific measurement module such that the first measurement module is configured to selectively connect the high dynamic analog-to-digital converter or the high bandwidth analog-to-digital converter to the first output of the first directive device, and/or wherein the second measurement module is the at least one specific measurement module such that the second measurement module is configured to selectively connect the high dynamic analog-to-digital converter or the high bandwidth analog-to-digital converter to the second output of the first directive device, and/or wherein the third measurement module is the at least one specific measurement module such that the third measurement module is configured to selectively connect the high dynamic analog-to-digital converter or the high bandwidth analog-to-digital converter to the first output of the second directive device, and/or wherein the fourth measurement module is the at least one specific measurement module such that the third measurement module is configured to selectively connect the high dynamic analog-to-digital converter or the high bandwidth analog-to-digital converter to the second output of the second directive device.

4. The test and/or measurement system according to claim 1, wherein the test and/or measurement system is configured to be selectively operated in a high dynamic measurement mode or a high bandwidth measurement mode.

5. The test and/or measurement system according to claim 4, wherein the at least one specific measurement module is configured to connect the high dynamic analog-to-digital converter to the respective output of the corresponding directive device when the test and/or measurement system is operated in the high dynamic measurement mode, and wherein the at least one specific measurement module is configured to connect the high bandwidth analog-to-digital converter to the respective output of the corresponding directive device when the test and/or measurement system is operated in the high bandwidth measurement mode.

6. The test and/or measurement system according to claim 4, wherein the first measurement module is the at least one specific measurement module such that the first measurement module is configured to connect the high dynamic analog-to-digital converter to the first output of the first directive device when the test and/or measurement system is operated in the high dynamic measurement mode, and wherein the first measurement module is configured to connect the high bandwidth analog-to-digital converter to the first output of the first directive device when the test and/or measurement system is operated in the high bandwidth measurement mode, and/or wherein the second measurement module is the at least one specific measurement module such that the second measurement module is configured to connect the high dynamic analog-to-digital converter to the second output of the first directive device when the test and/or measurement system is operated in the high dynamic measurement mode, and wherein the second measurement module is configured to connect the high bandwidth analog-to-digital converter to the second output of the first directive device when the test and/or measurement system is operated in the high bandwidth measurement mode, and/or wherein the third measurement module is the at least one specific measurement module such that the third measurement module is configured to connect the high dynamic analog-to-digital converter to the first output of the second directive device when the test and/or measurement system is operated in the high dynamic measurement mode, and wherein the third measurement module is configured to connect the high bandwidth analog-to-digital converter to the first output of the second directive device when the test and/or measurement system is operated in the high bandwidth measurement mode, and/or wherein the fourth measurement module is the at least one specific measurement module such that the fourth measurement module is configured to connect the high dynamic analog-to-digital converter to the second output of the second directive device when the test and/or measurement system is operated in the high dynamic measurement mode, and wherein the fourth measurement module is configured to connect the high bandwidth analog-to-digital converter to the second output of the second directive device when the test and/or measurement system is operated in the high bandwidth measurement mode.

7. The test and/or measurement system according to claim 1, further comprising a first signal source, wherein the first directive device is interconnected between the first signal source and the first port, wherein the first signal source is configured to generate a radio frequency signal to be forwarded to the first port, and wherein the radio frequency signal is a continuous wave signal or a modulated signal.

8. The test and/or measurement system according to claim 1, further comprising a second signal source, wherein the second directive device is interconnected between the second signal source and the second port, wherein the second signal source is configured to generate a radio frequency signal to be forwarded to the second port, and wherein the radio frequency signal is a continuous wave signal or a modulated signal.

9. The test and/or measurement system according to claim 1 further comprising a processor circuit that is configured to obtain data streams from the high dynamic analog-to-digital converters and a data stream from the high bandwidth analog-to-digital converter.

10. The test and/or measurement system according to claim 9, wherein the processor circuit is configured to correlate at least parts of the data streams with each other.

11. The test and/or measurement system according to claim 9, wherein the processor circuit is configured to apply a filtering function and/or a mixing function to at least one of the data streams.

12. The test and/or measurement system according to claim 9, wherein the at least one specific measurement module comprises a switching unit that is configured to connect the high dynamic analog-to-digital converter or the high bandwidth analog-to-digital converter to the respective output of the corresponding directive device, and wherein the switching unit is controlled by the processing circuit.

13. The test and/or measurement system according to claim 9, further comprising a first signal source and a second signal source, wherein the first directive device is interconnected between the first signal source and the first port, wherein the first signal source is configured to generate a radio frequency signal to be forwarded to the first port, and wherein the radio frequency signal is a continuous wave signal or a modulated signal, wherein the second directive device is interconnected between the second signal source and the second port, wherein the second signal source is configured to generate a radio frequency signal to be forwarded to the second port, and wherein the radio frequency signal is a continuous wave signal or a modulated signal.

14. The test and/or measurement system according to claim 13, wherein the processor circuit is configured to control the first signal source and/or the second signal source.

15. The test and/or measurement system according to claim 13, wherein the processor circuit is configured to calculate a pre-distortion for generating the radio frequency signal generated by the first signal source and/or a pre-distortion for generating the radio frequency signal generated by the second signal source.

16. The test and/or measurement system according to claim 1, further comprising a local oscillator, wherein the first measurement module, the second measurement module, the third measurement module, and the fourth measurement module each comprise at least one mixing unit, and wherein the mixing units are connected to the local oscillator.

17. The test and/or measurement system according to claim 1, wherein the first measurement module, the second measurement module, the third measurement module, and/or the fourth measurement module comprise a switchable attenuator, an amplifier and/or a filter.

18. The test and/or measurement system according to claim 1, wherein the first measurement module, the second measurement module, the third measurement module, and the fourth measurement module are commonly housed in a housing of the test and/or measurement system.

19. The test and/or measurement system according to claim 1, wherein the first directive device and/or the second directive device comprises at least one directive coupler and/or a resistive bridge, and/or wherein the first directive device and/or the second directive device are/is configured to adjust a coupling factor based on information gathered.

20. The test and/or measurement system according to claim 1, wherein the test and/or measurement system is configured to be operated in a calibration mode, wherein different calibration standards are alternatively connectable to the first port and the second port, wherein the test and/or measurement system is configured to calculate correction data and to apply the calculated correction data in a high dynamic measurement mode and in a high bandwidth measurement mode of the test and/or measurement system.

* * * * *